United States Patent [19]

Schwindt

[11] 4,089,581

[45] May 16, 1978

[54] PRINTED CIRCUIT BOARD CONNECTOR

[75] Inventor: Gary William Schwindt, Sharon, Conn.

[73] Assignee: Litton Systems, Inc., Beverly Hills, Calif.

[21] Appl. No.: 793,308

[22] Filed: May 3, 1977

[51] Int. Cl.² ........................ H05K 1/07; H01R 13/06

[52] U.S. Cl. ............................................. 339/176 MP

[58] Field of Search ........... 339/59 R, 59 M, 176 MP, 339/217 S

[56] References Cited

U.S. PATENT DOCUMENTS

| | | | |
|---|---|---|---|
| Re. 27,463 | 8/1972 | Sitzler | 339/59 R |
| 3,397,381 | 8/1968 | Gilissen | 339/176 MP |
| 3,680,038 | 7/1972 | Johnson | 339/176 MP |
| 3,783,433 | 1/1974 | Kurtz | 339/176 MP |
| 3,808,578 | 4/1974 | Hansen | 339/176 MP |
| 3,905,665 | 9/1975 | Lynch | 339/176 MP |
| 4,017,143 | 4/1977 | Knowles | 339/221 R |
| 4,030,792 | 6/1977 | Fuerst | 339/176 MP |

*Primary Examiner*—Neil Abrams
*Attorney, Agent, or Firm*—M. Michael Carpenter

[57] ABSTRACT

An electrical connector for mounting a daughter board is shown having two rows of aligned contacts which may be preassembled in an insulator housing upon a special tool prior to insertion into aligned apertures in a mother board. The contacts are each provided with outwardly facing shouldered tabs which engage shouldered tabs on the inner surface of the bottom side walls of the housing. The lower portions of the housing side walls are flexible to permit the disengagement of the shoulders and removal of the housing. The side walls are joined by webs which create contact-receiving modules therebetween. Each module is free of obstructions above the upper surface of the shouldered contact tab to permit removal and replacement of the contact without removing the housing.

14 Claims, 8 Drawing Figures

PRINTED CIRCUIT BOARD CONNECTOR

BACKGROUND OF THE INVENTION

The present invention relates to a printed circuit board connector and, more particularly, to an improved printed circuit board connector which may be preassembled upon a preassembly tool for insertion into apertures in a printed circuit board. Once placed upon a printed circuit board, the connector components can be disassembled from the connector without removing it from the board. That is, individual contacts may be removed and replaced without removing the insulator housing, and the insulator housing may be removed and replaced without disturbing the contacts.

It is well known in the prior art to assemble a plurality of contacts into an insulator to form a discrete electrical connector which mounts a printed circuit board. Such a board often has one electrical circuit assembled on its surface and may be referred to as a "daughter board". It is also known to press fit the assembled discrete electrical connector into a plurality of aligned plated-through holes in a second, larger printed circuit board, often referred to as a "mother board". Such an arrangement is taught by U.S. Letters Patent No. 3,530,422, by D. S. Goodman, which issued Sept. 22, 1970. The inventive idea of the Goodman patent is to construct a discrete connnector and its contacts to enable the contacts to support the connector housing as pressure is applied to the housing to press the contacts into apertures in the mother board.

The prior art has moved away from the utilization of discrete circuit board connectors toward the concept of preassembling a connector by first pressing the contacts into the printed circuit board, or mother board, and then placing a housing over the contacts. Such an arrangement is shown in FIGS. 4—7 of U.S. Letters Patent No. b 3,518,610, by D. S. Goodman, et al., which issued June 30, 1970. In Goodman, a few contacts are first inserted into the mother board before a discrete daughter board connector is placed upon the mother board over the first assembled contacts.

The concept of placing all the contacts into a mother board and then placing a housing over the contacts is taught in U.S. Letters Patent No. 3,659,243, by G. H. Gluntz, which issued Apr. 25, 1972. Here, the assembled connector receives an integrated circuit, or IC, which is another form for mounting an electrical circuit. A connector in which all contacts are first inserted into a mother board and a housing capable of mounting a daughter board is then snapped over the contacts is shown in U.S. Letters Patent No. 3,783,433, by H. N. Kurtz, et al., which issued Jan. 1, 1974, and is assigned to the assignee of the present invention.

To simplify the assembly of the plurality of contacts, it is known to form the contacts from a sheet metal strip leaving one end of the contacts attached to a carry strip, or selvedge strip. The selvedge strip may then be cut to accommodate a predetermined number of contacts in an aligned configuration for insertion into the printed circuit board apertures. Such an arrangement is shown in U.S. Letters Patent No. 2,947,965, by R. R. Scoville, which issued on Aug. 2, 1960. While the Scoville reference teaches the concept of comb-loading contacts, there is no reference made to an insulated housing. The Gluntz patent illustrates the concept of comb-loading a plurality of contacts and then placing a housing over the contacts as aforesaid.

Other prior art patents showing the concept of combloading include U.S. Letters Patent No. 2,995,617, by P. A. Maximoff, et al., and U.S. Letters Patent No. 3,182,276, by H. E. Ruehlemann. Additional patents showing the concept of press fitting contacts into a printed circuit board and then snapping a housing over the contacts include U.S. Letters Patent No. 3,671,917, by J. P. Ammon, et al., U.S. Letters Patent No. 3,676,926, by J. A. Kendall, and U.S. Letters Patent No. 3,769,679, by J. A. Kendall.

The prior art, represented by the patents cited above, teaches the concept of manufacturing an electrical connector by either manufacturing a discrete, stand alone connector which is then assembled on a circuit board or by press fitting a plurality of contacts into a printed circuit board and then snapping an insulator housing over the contacts. The latter method is basically a two-step manufacturing process.

The concept of eliminating the second step of snapping an insulator housing over the contacts pressed into a printed circuit board is described in a copending patent application, Ser. No. 793,300, filed May 3, 1977, by Richard F. Barry, Charles A. Gourley and Dennis G. Kohanek, entitled "Method and Apparatus for Preassembling a Printed Circuit Board Connector," which is assigned to the same assignee as the present invention.

SUMMARY OF THE INVENTION

This invention describes a printed circuit board connector which may be utilized with the method and apparatus described in the Barry, et al. patent application mentioned above.

The printed circuit board connector utilizes an insulator housing having side walls joined by a series of webs which forms contact-receiving modules between the webs and the side walls. Each contact is aligned in at least one row with a tab portion having top and bottom shoulders extending toward the nearest side wall. The bottom of the housing side wall is provided with an inwardly extending tab having a top shoulder that engages the bottom shoulder of each contact tab. The bottom of the housing side wall is relieved to form a flexible member which permits the disengagement of the housing shoulder from the contact shoulder. Each contact-receiving module is free of obstructions above the top shoulder of the contact tab to permit the removal and replacement of the contact mounted therein.

One object of the present invention is to provide a printed circuit board connector which may be preassembled upon a special tool and then inserted into apertures in a printed circuit board or mother board without requiring additional assembly steps. Once assembled, the housing may be removed and replaced without damaging the contacts. A further object is to provide individual contacts which may be removed and replaced without damaging the housing or the board in which they mount.

DESCRIPTION OF THE DRAWINGS

Still further objects and a better understanding of the present invention will be obtained by reference to the following specification, when considered in connection with the accompanying drawings, wherein:

Referring now to the drawings, FIG. 1 shows a connector 10 which comprises a plurality of contacts 12 and an insulator housing 14. The contacts 12 may be mounted upon a suitable selvedge strip 16, shown in FIG. 2. In the preferred embodiment, two predetermined lengths of the selvedge strip 16 are cut and placed in a preassembly tool, not shown, but described in the copending Barry, et al. patent application referred to hereinabove. The insulator housing 14 is placed about the contacts 12 on the tool and the preassembled connector is then inserted into plated-through holes 18 in a printed circuit board or mother board 20.

Figure 3:
FIG. 3 is a sectional view taken along line 3—3 of FIG. 2.
Figure 4:
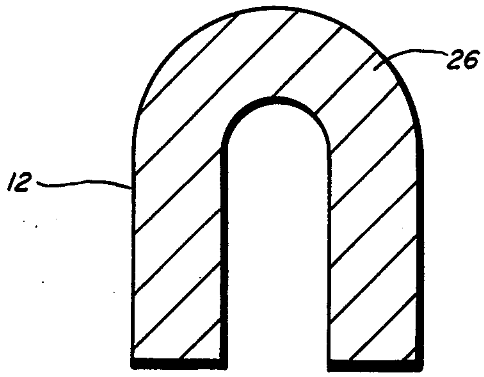
FIG. 4 is a sectional view taken along line 4—4 of FIG. 2.

The assembled contacts form two facing rows which may include any number of contacts depending upon the desired size of a printed circuit card or daughter board which is inserted in the open top of the housing 14. Each contact 12 includes a lowermost wire wrap tail 22 joined to a printed circuit board engaging section 24 whose C-shaped cross section is described in U.S. Letters Patent No. 4,017,143, by Robert G. Knowles, which issued Apr. 12, 1977. Extending from the C-shaped circuit board engaging section is a U-shaped contact tab 26. The legs of the "U" form tabs having top and bottom shoulders, 28 and 30. Extending upwardly from the tabs 26 is an inwardly bowed section 32 whose cross section is also partially curved, as shown in FIG. 3. The bowed section 32 terminates in a T-shaped top section having laterally extending ear tabs 34 arranged at right angles to the extending to the extending tabs 26. It will be noted in FIG. 1 that bowed sections 32 may include two different bowed configurations having the farthest inward extension of the bow or knee occurring at different elevations. Through this arrangement, the contacts 12 contact conductive elements upon the surface of a daughter board 33 at different times during the insertion thereof in the open top of the housing between the contacts.

Figure 5:
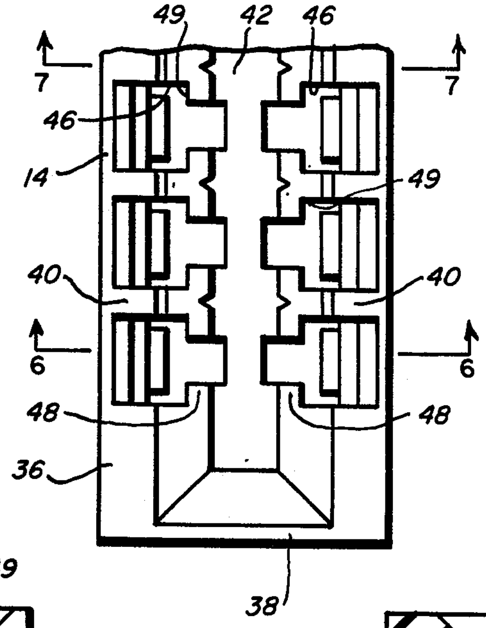
FIG. 5 is a top, plane view partially broken away showing an insulator housing used in the present invention.

Insulator housing 14 includes side walls 36 joined at their ends by end walls 38, only one of which is seen in FIG. 5. Between the end walls, the side walls are joined by web members 40 which are slotted at 42, their midpoint, to receive the printed circuit card or daughter board 33. The lower portion of the webs 40 are joined by a central beam 44 to complete the formation of contact-receiving modules 46 between the side walls 36, the beam 44 and the webs 40. Extending from the surfaces of the webs 40 at the edge of the slot 42 and parallel to the major axis of the central beam 44 are contact preload columns 48 which form vertical stop surfaces 49 behind which the contact ears 34 are retained.

The central beam 44 is tapered on each side with a ramp portion 50 which tapers in an outward and upward direction to merge with the inner surface 49 of the preload columns 48. Once the housing 14 is removed from the contacts, it may be replaced by insertion over the contacts 12, wherein the ramped surfaces 50 force the contacts apart by engagement with the ears 34 for guiding the contacts into their proper location behind surface 49. This arrangement preloads the contacts 12 within housing 14.

Figure 6:
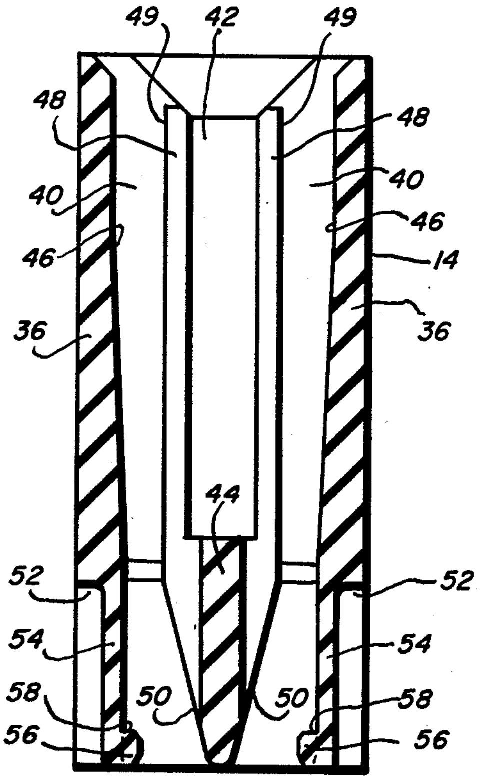
FIG. 6 is a sectional view taken along line 6—6 of FIG. 5.
Figure 7:
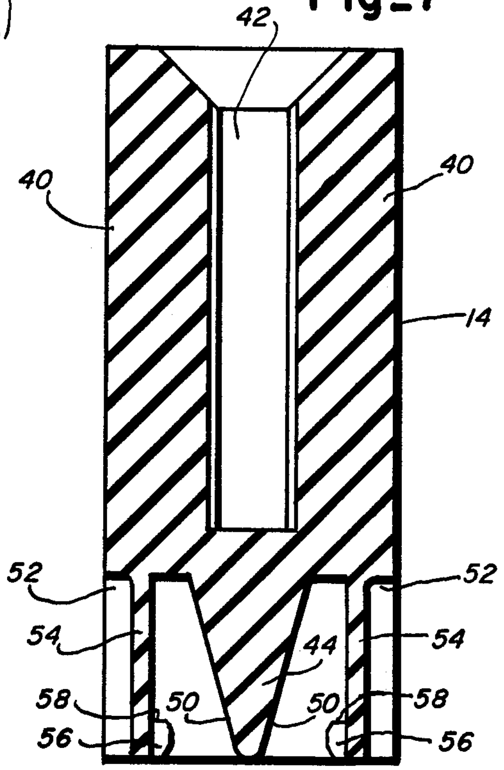
FIG. 7 is a sectional view taken along line 7—7 of FIG. 5.

The bottom portions of the side walls 36 are relieved at 52 to form thin flexible members 54. Extending from these flexible members 54 are inwardly facing housing tabs 56 having top shoulders 58. It will be seen from FIGS. 6 and 7 that the tabs 56 are interrupted to enhance the flexibility of the flexible members 54. The engagement of the housing shoulder 58 under the bottom contact shoulder 30 retains the housing 14 upon the printed circuit board 20. The flexibility of the members 54 permits the easy removal of the housing 14 by simply applying an upward force to the housing which causes the disengagement of the shoulders. Further, the housing 14 may be easily replaced by simply inserting it down upon the contacts 12 as outlined above. Further insertion allows the flexible members 54 to yield for latching the housing in the position shown.

Figure 1:
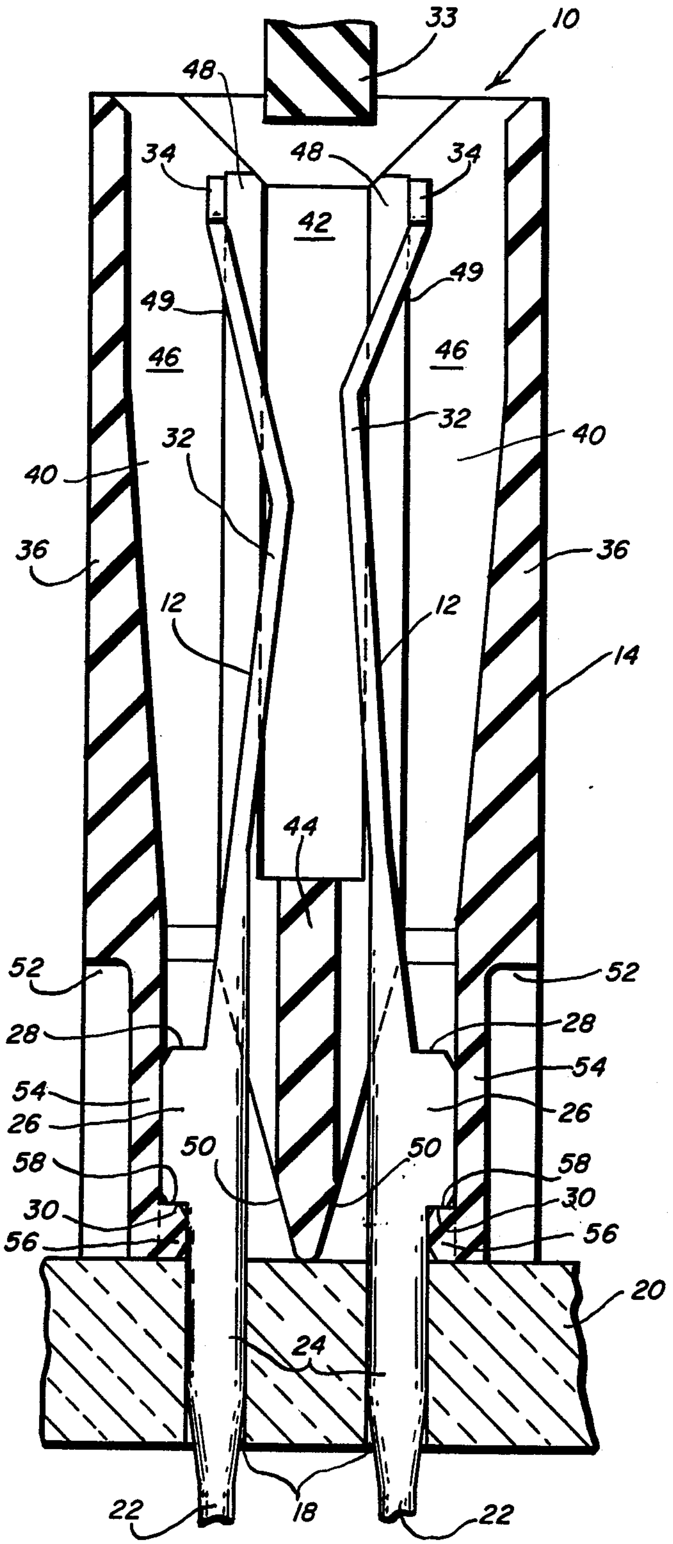
FIG. 1 is a cross-sectional end view, showing the printed circuit board connector of the present invention.
Figure 2:
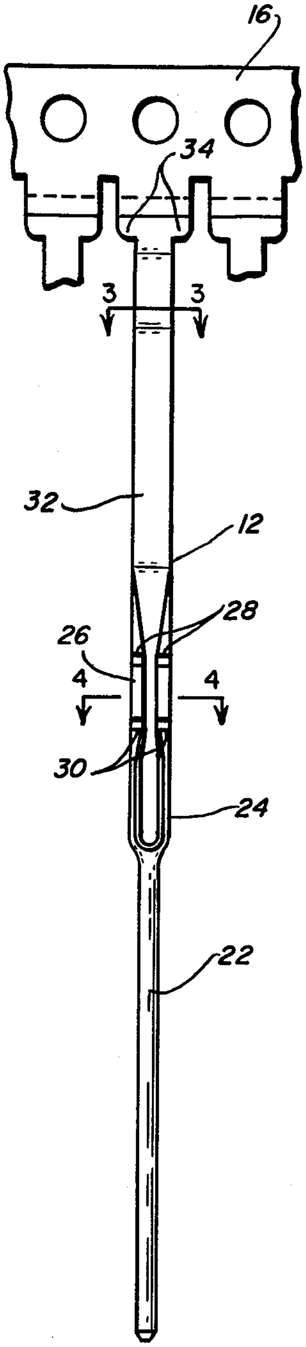
FIG. 2 is an elevational view showing a contact used in the present invention.

In FIG. 1, it will be seen that the tabs 56 of the housing partially close the lower contact-receiving modules 46. However, the upper or top portion of the contact-receiving modules 46 are free of obstructions to permit the contacts 12 to be removed therefrom in a straight upward direction. Replacement of the contacts is accomplished by the utilization of a tool, not shown, which engages the top shoulder 28 and forces the contact through the housing 14 into the printed circuit board 20. As the contact is inserted into the housing, it fits against the preload columns 48 and side wall 36 in the contact-receiving module 46 with the tool in the obstruction-free area therebetween to permit the insertion of the tool and contact to the position shown.

Figure 8:
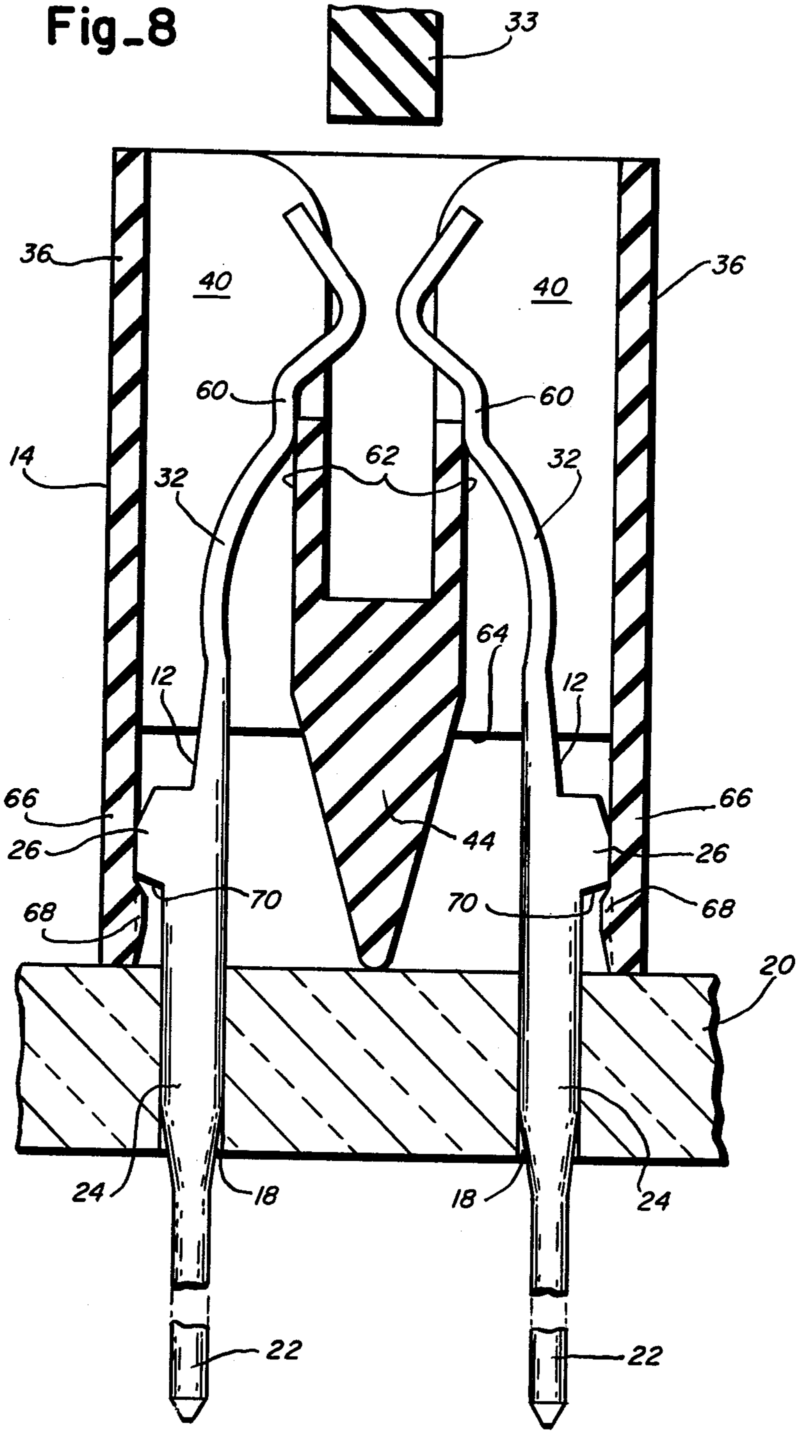
FIG. 8 is an end view, shown in cross section, showing a second embodiment of the present invention.

Referring now to FIG. 8, a modification of the printed circuit board connector is shown. Here, the contacts 12 are provided with the same wire wrap section 22 and connector board engaging section 24. The U-shaped tab portions 26 have been slightly modified, while the bowed section 32 is interrupted by a flat vertical stop 60. The flat stop 60 rests against the central beam 44 that has been modified to include a generally U-shaped configuration, wherein the legs of the "U" form surfaces 62 which contact the flat stops 60 of the contacts 12. Through this configuration, the contacts 12 are preloaded to replace the function of the ears 34 of FIG. 1 which are eliminated here.

The flat stops 60 on the bowed portions 32 provide a contact point against the outer surface 62 which does not vary with tolerance deviation. That is, a prior art arrangement utilized a contact point at a similar location, but did not provide a flat stop 60. In the prior art arrangement, the contact point varied with dimensional changes in the contacts 12 and housing 14, thus subjecting the preload pressure to changes as the tolerances varied. The use of the flat stop 60 eliminates this deviation in contact preload pressure.

The housing 14 in FIG. 8 is provided with thinner side walls 36 than in FIG. 1. However, the walls are not reduced in thickness to form the flexible member, but, rather, the walls are relieved by reliving the web members 40 at 64 to form a flexible member 66 in the lower portions of the walls 36. The housing tabs 68 are also slightly thinner than the tabs 56. Tabs 68 are interrupted to enhance the flexibility of the flexible members 66. However, it is not necessary to interrupt the tabs 68 to retain the flexibility, due to the narrower configuration of the tab. Note that the sharp lower shoulders 70 on the contact tabs 26 enhance their retention force against the tabs 68. Obviously, modifications of the printed circuit board connector other than those described herein with regard to FIG. 8 are possible.

The embodiments of the invention in which an exclusive property or privilege is claimed are defined as follows:

1. An electrical connector for mounting a printed circuit card upon a printed circuit board, comprising:

a plurality of conductive contacts aligned in at least one row on said printed circuit board;

said contacts each having a laterally extending contact tab that forms a top and a bottom contact shoulder;

an insulator housing having side walls with top and bottom edges, said side walls joined by webbed means extending perpendicularly between said side walls from the top edges thereof to a point inside and short of said bottom edges to form individual contact-receiving modules open at the tops and bottoms thereof;

said housing having at least one housing tab laterally extending from the bottom edge of said housing side wall into each contact-receiving module;

said housing tab having a top shoulder that engages said bottom contact shoulders for retaining said housing against said printed circuit board, said top shoulder of said housing tab being below said point inside and short of said bottom edge; and said side walls each having a lower portion between said bottom edge of said side wall and said point inside and short of said bottom edge formed by said webbed means joining said housing side wall, said lower portion forming a flexible member which permits said housing tab to yield from its engagement with said contacts for releasing said housing from said printed circuit board.

2. An electrical connector as claimed in claim 1, wherein said webbed means joining said side walls is relieved at their top edges to receive said printed circuit card between said side walls.

3. An electrical connector as claimed in claim 2, wherein said plurality of contacts are arranged in two rows on each side of said relief in said webbed means, said laterally extending contact tabs extend outwardly from each side of said relief, and said housing tab includes tabs on each side wall extending inwardly toward said relief.

4. An electrical connector as claimed in claim 3, wherein said plurality of contacts each includes a C-shaped printed circuit board engaging section and a U-shaped section that merges into said C-shaped section to form said laterally extending contact tab.

5. An electrical connector as claimed in claim 3, wherein said housing side walls are symmetrical about two rows of said contacts and said webbed means joining said side walls include a ramped central beam extending parallel to and between said lower portions of said side walls which guides said contacts into said housing modules as said housing is placed over said two rows of contacts on said printed circuit board.

6. An electrical connector as claimed in claim 1, additionally comprising: said housing side walls symmetrical about two rows of facing contacts, said contacts having bowed printed circuit card contact sections facing one another, said contacts having preload tabs extending from said bowed sections at right angles to the bowed direction, and said housing webbed means having shoulder columns which extend into said housing modules against which said preload tabs rest to preload said contacts.

7. An electrical connector as claimed in claim 1, additionally comprising: said housing side walls symmetrical about two rows of facing contacts, said contacts having bowed printed circuit card contact sections facing one another, each of said contacts having a flat, vertical stop in said bowed section, and said housing webbed means joined by a central beam extending between said two rows of contacts having vertical sides against which said flat, vertical stop of each contact rests under the urging of said bowed section for preloading said contact.

8. An electrical connector as claimed in claim 1, wherein said housing tab is interrupted at spaced intervals along the full length of said bottom edge of said housing side wall to partially close said contact-receiving module and improve the flexibility of said flexible member.

9. An electrical connector as claimed in claim 1, wherein said lower portion of said housing side wall is inwardly relieved from its outer surface to form a thin flexible member.

10. An electrical connector as claimed in claim 1, wherein each of said housing contact-receiving modules is free of obstructions along its inner surface on said housing side wall from said top edge to said top contact shoulder to permit removal and replacement of said contact and clearance for assembly of said connector.

11. An electrical connector for mounting upon a printed circuit board, comprising:

a plurality of conductive contacts arranged in at least one row on said printed circuit board;

each contact having a bowed section extending in one direction and a laterally extending tab having top and bottom shoulders extending in the opposite direction; p1 an insulated housing having side walls joined by perpendicularly extending connecting webs to form contact-receiving modules between said webs, each module having a top and bottom opening;

said connecting webs extending downwardly from the top of said side walls to a point inside and short of the bottom of said side walls wherein the remaining lower portions of said side walls are free of connection to said webs to enhance the flexibility of said lower portion;

a housing tab extending inwardly from the bottom of said lower portion of said housing side wall for partially closing said bottom opening of said module, said tab having a top shoulder that engages said bottom contact shoulder to retain said housing upon said printed circuit board, said top shoulder of said housing tab being below said point inside and short of the bottom of said side walls; and said lower portion of said housing side wall relieved along its outer surface wherein the thickness of said lower portion is less than said side wall to form a thin flexible lower portion member which permits said top shoulder of said tab to disengage from said bottom contact shoulder to release said housing.

12. An electrical connector as claimed in claim 11, wherein said at least one row of contacts includes two rows of contacts having said bowed portions extending toward one another and said laterally extending tabs extending outwardly and away from said bowed portions, and said housing tab on said housing side wall includes tabs extending inwardly into said modules from both of said side walls.

13. An electrical connector as claimed in claim 11, wherein said inwardly extending tabs are interrupted to form tabs whose length is less than the width of said modules to further enhance flexibility of said lower portion of said side wall.

14. An electrical connector as claimed in claim 11, wherein said module opening is unobstructed between said top shoulder on said contact tab and said top module opening to permit the removal and replacement of said contact while said housing remains upon said printed circuit board.

* * * * *